United States Patent [19]

Osterweil

[11] Patent Number: 5,218,639
[45] Date of Patent: Jun. 8, 1993

[54] METHOD AND APPARATUS FOR CHANGING BIT RATE OF DIGITIZED ANALOG

[75] Inventor: Josef Osterweil, Rockville, Md.

[73] Assignee: GTE Government Systems Corporation, Waltham, Mass.

[21] Appl. No.: 801,307

[22] Filed: Dec. 2, 1991

[51] Int. Cl.⁵ .............................................. H04K 1/10
[52] U.S. Cl. ........................................ 380/34; 375/1; 375/122; 381/31; 381/34
[58] Field of Search ..................... 380/34; 375/1, 122; 381/31, 34; 370/84, 89

[56] References Cited

U.S. PATENT DOCUMENTS 4,041,391  8/1977  Deerkoski ............................. 375/1
4,763,319  8/1988  Rozenblit ............................. 370/84
4,922,537  5/1990  Frederiksen ......................... 381/31

Primary Examiner—David Cain
Attorney, Agent, or Firm—J. Stephen Yeo

[57] ABSTRACT

Method and apparatus for changing the bit rate of a digitized analog signal stream from a first bit rate to a second bit rate. A first sequence generator provides a digital predictor sequence clocked at the first bit rate. A combiner has an output providing a combined digital stream at the first bit rate, combining the digital predictor sequence at the first bit rate and the digital analog signal stream at the first bit rate. An adaptive processor has its input coupled to at the output of the signal combiner. The adaptive processor has variable weights which are responsive to an error signal, an output providing a processed combined digital stream having a bit rate responsive to the weights, and an error signal input port. A second sequence generator provides the same digital predictor sequence, but clocked at the second bit rate. An error detector, coupled to output of the adaptive processor and the digital predictor sequence clocked at the second bit rate, provides an error signal representing the difference between the bit rate of the processed digital sequence and the digital predictor sequence clocked at the second bit rate. The error signal is coupled to the error signal port of the adaptive processor is used to adjust the weights of the adaptive processor to minimize the error signal and therefore minimize the effects of the difference between the bit rate of the processed combined digital stream and the second bit rate. The apparatus strips the digital predictor sequence from the processed combined digital stream. The combined digital stream may be sent through a satellite communication system, allowing correction of any doppler frequency shifting due to a drifting satellite and interfaces to systems with poor or unknown timing standards.

8 Claims, 1 Drawing Sheet

METHOD AND APPARATUS FOR CHANGING BIT RATE OF DIGITIZED ANALOG

BACKGROUND OF THE INVENTION

This invention pertains to digital communication, and more particularly, is concerned with bit rate translation of a digital stream.

Current bit rate translation techniques include: i) re-sampling by interpolation and decimation processes in the digital domain; and ii) conversion of the digital signal to analog signal and back to digital signal at the new sampling rate in the analog domain.

The process of interpolation multiplies the sampling rate by an integer. The decimation process divides the sampling rate by an integer. The combination of the two processes consecutively can modify the sampling rate by any rational number. This technique requires a prior knowledge of the ratio of the two sampling rates. In some cases, it is impossible to predict timing discrepancy between digital media, particularly when the timing source has drift associated with it, such as caused by doppler shift by drifting satellites.

The digital to analog conversion and back to digital at an independent sampling rate is a technique that is inherently effective in overcoming any timing discrepancies. The technique, however, is costly because of the use of anti-aliasing filters and with high resolution analog to digital and digital to analog converters. This technique also contributes to reduction in signal to noise ratio due to additional quantization noise.

It is desirable to provide a method and an apparatus for changing the bit rate of a digitized analog signal without the need of prior knowledge of bit rates, or the need for expensive components.

SUMMARY OF THE INVENTION

According to one aspect of the invention, there is provided apparatus for changing the bit rate of a digitized analog signal stream from a first bit rate to a second bit rate. A first sequence generator provides a digital predictor sequence clocked at the first bit rate. A combiner has an output providing a combined digital stream at the first bit rate, combining the digital predictor sequence at the first bit rate and the digital analog signal stream at the first bit rate. An adaptive processor has its input coupled at the output of the signal combiner. The adaptive processor has variable weights which are responsive to an error signal, an output providing a processed combined digital stream having a bit rate responsive to the weights, and an error signal input port. A second sequence generator provides the same digital predictor sequence, but clocked at The second bit rate. An error detector, coupled to the output of the adaptive processor and the digital predictor sequence clocked at the second bit rate, provides an error signal representing the difference between the bit rate of the processed digital sequence and the digital predictor sequence clocked at the second bit rate. The error signal coupled to the error signal port of the adaptive processor is used to adjust the weights of the adaptive processor to minimize the error signal and therefore minimize the effect of the difference between the bit rate of the processed combined digital stream and the second bit rate. The apparatus strips the digital predictor sequence from the processed combined digital stream.

DETAILED DESCRIPTION OF THE INVENTION

Figures 1, 2:
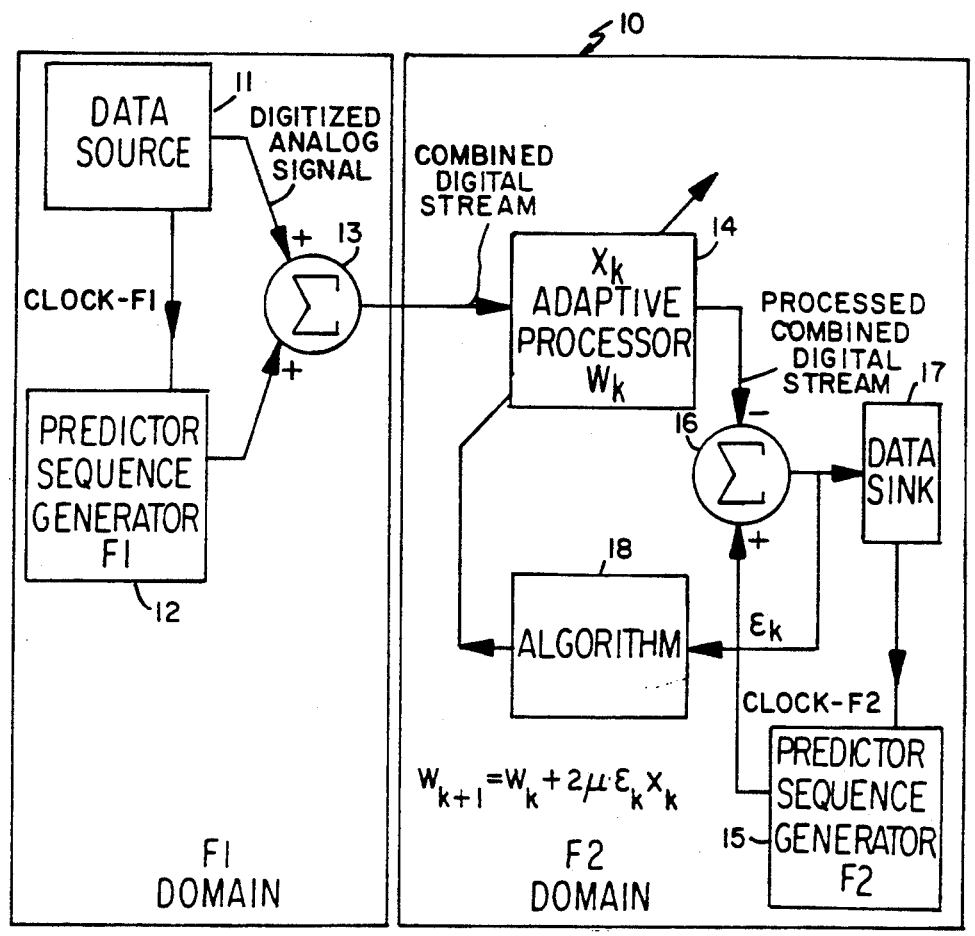
FIG. 1 is a block diagram of an apparatus structure embodying the invention.
FIG. 2 is an adaptive processor use in the structure.

In keeping with the invention, adaptive signal processing changes the bit rate of a digitized analog signal stream from a first bit rate to a second bit rate. Adaptive signal processing requires three basic elements: structure; predictor; and algorithm.

Referring the FIG. 1 for an overview of a preferred structure 10. A digitized analog signal stream at the first bit rate F1 is coupled from data source 11. A first sequence generator 12 provides a digital predictor sequence clocked at the first bit rate F1. A combiner 13 has an output providing a combined digital stream at the first bit rate F1, comprised of the digital predictor sequence at the first bit rate F1 and the digitized analog signal stream from data source 11 at the first bit rate F1.

The combined digital stream may be sent through a satellite, or other communication system, to adaptive processor 14.

Adaptive processor 14 has its input coupled to at output of the signal combiner 13. Adaptive processor 14 has variable weights which are responsive to an error signal, an output providing a processed combined digital stream having a bit rate responsive to the weights, and an error signal input port. A second sequence generator 15 provides the same digital predictor sequence, but clocked at the second bit rate F2. An error detector 16, coupled to the output of the adaptive processor 14 and the digital predictor sequence clocked at the second bit rate F2 from generator 15, provides an error signal representing the difference between the bit rate of the processed digital sequence and the digital predictor sequence clocked at the second bit rate. The error signal, as processed by algorithm 18, is coupled to the error signal port of the adaptive processor 14 for adjusting the weights to minimize the error signal and therefore minimize the difference between the bit rate of the processed combined digital stream and the second bit rate F2. The error detector 16 strips the digital predictor sequence from the processed combined digital stream, yielding the digitized analog stream at F2, which may be stored in data bank 17.

As a feature of the invention, the predictor is a digital sequence generated at two sampling rates, first bit rate F1 and second bit rate F2. This sequence, when crossing from F1 domain into the F2 domain, will occasionally skip a sample when F1 is more than F2, or occasionally read a sample twice when F1 is more than F2. The imperfect sequence travels with the digitized analog signal through adaptive processor 14 and compared to the F2 domain original sequence. The error signal, as processed by algorithm 18, changes the weights to minimize the error between the two sequences.

The predictor sequence is not correlated to the source signal so that minimum error will occur when the predictor sequence arriving with the signal is restored and thus cancelled. The predictor sequence can be selected from a variety of signals. The criteria for the predictor sequence is that it must be uncorrelated to the input signal and must be, therefore, generated independently. The predictor sequence in both F1 and F2 domains must be highly correlated or identical and should be spread over the entire spectrum of interest. A pseudo-random sequence is preferred.

The least mean square algorithm is the preferred algorithm. The factor $\mu$ associated with the least mean square algorithm, as shown below, is selected for optimum performance in terms of error convergence mode, time and residual noise.

$$W_{k+1} = W_k + 2\mu\epsilon_k X_k$$

The least mean square algorithm and other standard algorithms for adaptive signal processing are well know in the art, and therefore not described or claimed.

The preferred adaptive processor, shown in FIG. 2, is a tapped delay line structure. The terms $x_k$ down the tapped delay line can be expressed as $x_{0k}, x_{1k}, x_{2k}, \ldots$ and $x_{1k}$. Each element represents the propagated input as it appears in the tapped delay line. The size of all input elements is the same and equal to the signal resolution. The weights (multiplication coefficients), $w_{0k}, w_{1k}, w_{2k}, \ldots, w_{1k}$, resolution will contribute to the quantization error and the truncation effects. An increase of the number of taps will improve performance, e.g. accuracy and fidelity, up to a point beyond which further tap increase cause increasing quantization and truncation effects.

The tapped delay line is economical for typical communication channels, however for other applications, parallel combination structures, fast fourier transformations, and other adaptive processors may be preferred to the tapped delay line configuration.

The input data rate may be different from the output data rate as the adaptive process converts from one sample rate to another. Neither the input date rate or the output data rate needs to be previously known. The method and apparatus are capable of processing a digitized analog signal at one sample rate so that when transferred in another sample rate, the signal will maintain it's original phase and frequency without prior knowledge of the other sample rate and with the capacity of adapting to the changes of that new sample rate. Due to the adaptive process, optimum performance is provided under any condition as the adaptive processor 14 will adapt to the best solution for each case.

The invention is particularly well suited for correcting doppler frequency shifting caused by drifting communication satellites and for interfaces to systems with poor or unknown timing standards.

The preferred embodiment and best mode of practicing the invention have been described. Various modification will be apparent to those skilled in the art, in view of these teaching. Accordingly, the scope of the invention is to be determined by the following claims.

What is claimed is:

1. Apparatus for changing the bit rate of a digitized analog signal stream, from a data source, from a first bit rate to a second bit rate, comprising:

a first sequence generator providing a digitized predictor sequence clocked at said first bit rate;

a signal combiner having a first input coupled to said output of said first sequence generator, a second input coupled to said data source, and an output providing a combined digital stream combining said first bit rate and said digital analog signal stream at said first bit rate;

an adaptive processor having an input coupled to at the output of said signal combiner, said adaptive processor having variable weights responsive to an error signal, an output providing a processed combined digital stream having a bit rate responsive to said weights, and an error signal input port;

a second sequence generator having an output providing the same digital predictor sequence as provided by the first sequence generator, but clocked at said second bit rate;

an error detector coupled to said output of the adaptive processor and said output of said second sequence generator, having an output providing an error signal representing the difference between the bit rate of the processed digital sequence and the digital predictor sequence clocked at the second bit rate;

said output of said error detector coupled to said error signal port of said adaptive processor to adjust the weights of said adaptive processor to minimize said error signal and therefore minimize the effects of the difference between the bit rate of the processed combined digital stream and said second bit rate; and means for stripping said digital predictor sequence from said processed combined digital stream.

2. The apparatus of claim 1 wherein said digital predictor sequence is pseudo-random.

3. The apparatus of claim 1 wherein said input of said adaptive processor is coupled to the output of said signal combiner through a satellite communication system.

4. The apparatus of claim 3 wherein said digital predictor sequence is pseudo-random.

5. Method for changing the bit rate of a digitized analog signal stream from a first bit rate to a second bit rate, comprising the steps of:

providing said digitized analog signal stream at said first bit rate;

providing a digital predictor sequence clocked at said first bit rate;

combining said first bit rate and said digital analog signal stream at said first bit rate into a combined digital stream;

adaptively processing said combined digital stream to provide a processed combined digital stream having a bit rate responsive to said weights responsive to an error signal;

providing said digital predictor sequence clocked said second bit rate;

providing an error signal representing the difference between the bit rate of the processed digital sequence and the digital predictor sequence clocked at the second bit rate;

minimizing said error signal by said adaptive processing and thereby minimizing the effects of the difference between the bit rate of the processed combined digital stream and said second bit rate; and stripping said digital predictor sequence from said processed combined digital stream.

6. The method of claim 5 wherein said digital predictor sequence is pseudo-random.

7. Method for changing the bit rate of a digitized analog signal stream from a first bit rate to a second bit rate, comprising the steps of:

providing said digitized analog signal stream at said first bit rate;

providing a digital predictor sequence clocked at said first bit rate;

combining said first bit rate and said digital analog signal stream at said first bit rate into a combined digital stream;

sending said combined digital stream through a satellite communication system;

adaptively processing said combined digital stream to provide a processed combined digital stream having a bit rate responsive to said weights responsive to an error signal;

providing the same digital predictor sequence, but clocked at said second bit rate;

providing an error signal representing the difference between the bit rate of the processed digital sequence and the digital predictor sequence clocked at the second bit rate;

minimizing said error signal by said adaptive processing and thereby minimizing the effects of the difference between the bit rate of the processed combined digital stream and said second bit rate; and stripping said digital predictor sequence from said processed combined digital stream.

8. The method of claim 7 wherein said digital predictor sequence is pseudo-random.

* * * * *